United States Patent
Yoon et al.

(10) Patent No.: US 8,138,019 B2
(45) Date of Patent: Mar. 20, 2012

(54) INTEGRATED (MULTILAYER) CIRCUITS AND PROCESS OF PRODUCING THE SAME

(75) Inventors: Sang Won Yoon, Ann Arbor, MI (US); Alexandros Margomenos, Pasadena, CA (US)

(73) Assignee: Toyota Motor Engineering & Manufactruing North America, Inc., Erlanger, KY (US)

( * ) Notice: Subject to any disclaimer, the term of this patent is extended or adjusted under 35 U.S.C. 154(b) by 34 days.

(21) Appl. No.: 12/611,285

(22) Filed: Nov. 3, 2009

(65) Prior Publication Data

US 2011/0101533 A1    May 5, 2011

(51) Int. Cl.
*H01L 21/00*   (2006.01)
*H01L 21/30*   (2006.01)

(52) U.S. Cl. ........ 438/108; 438/109; 438/119; 438/455; 438/624; 257/686; 257/777; 257/779; 257/780; 257/E21.503; 257/E21.508; 257/E21.511; 257/E23.023; 257/E25.013; 427/97.2

(58) Field of Classification Search .......... 438/108, 438/109, 119, 455, 624; 257/686, 777, 779, 257/780, E21.503, E21.508, E21.511, E23.023, 257/E25.013; 427/97.2
See application file for complete search history.

(56) References Cited

U.S. PATENT DOCUMENTS

| | | | | |
|---|---|---|---|---|
| 4,818,728 A * | 4/1989 | Rai et al. | | 438/108 |
| 5,196,371 A * | 3/1993 | Kulesza et al. | | 438/119 |
| 5,789,271 A | 8/1998 | Akram | | |
| 5,789,278 A | 8/1998 | Akram et al. | | |
| 5,834,366 A | 11/1998 | Akram | | |
| 5,878,485 A | 3/1999 | Wood et al. | | |
| 5,918,364 A | 7/1999 | Kulesza et al. | | |
| 6,002,180 A | 12/1999 | Akram et al. | | |
| 6,127,736 A | 10/2000 | Akram | | |
| 6,190,940 B1 | 2/2001 | DeFelice et al. | | |
| 6,410,415 B1 | 6/2002 | Estes et al. | | |
| 6,555,917 B1 * | 4/2003 | Heo | | 257/777 |
| 7,271,028 B1 | 9/2007 | Pace | | |
| 7,335,988 B2 | 2/2008 | Farnworth et al. | | |
| 8,043,893 B2 * | 10/2011 | Furman et al. | | 438/108 |
| 2006/0292824 A1 * | 12/2006 | Beyne et al. | | 438/455 |
| 2007/0048901 A1 | 3/2007 | Hwan | | |
| 2007/0085180 A1 | 4/2007 | Kim et al. | | |
| 2007/0172987 A1 | 7/2007 | Dugas et al. | | |
| 2008/0107802 A1 * | 5/2008 | Kawaguchi et al. | | 427/97.2 |

OTHER PUBLICATIONS

H. Kim et a, "Characterization of low-temperature wafer bonding using thin-film parylene", IEEE Journal of Microelectromechanical Systems, pp. 1347-1355, 2005.
A.L. Thangawng et al., Bond-Detach Lithography: A Method for Micro/Nanolithography by Precision PDMS Patterning Small, pp. 132-138, 2007.

* cited by examiner

*Primary Examiner* — Dao H Nguyen
(74) *Attorney, Agent, or Firm* — Gifford, Krass, Sprinkle, Anderson & Citkowski, P.C.

(57) ABSTRACT

A process of forming a semiconductor integrated circuit that includes the steps of: forming at least a first element having a first pattern of conductive material and including a polymer layer surrounding the conductive material, forming at least a second element having a second pattern of conductive material and including a polymer layer surrounding the conductive material, positioning the first element relative to the second element, and bonding the polymer layer of the first and second elements at a temperature below a melting temperature of the conductive materials of the first and second elements wherein the conductive material of the first element contacts the conductive material of the second element and is maintained in position by the bonded polymer layers.

26 Claims, 8 Drawing Sheets

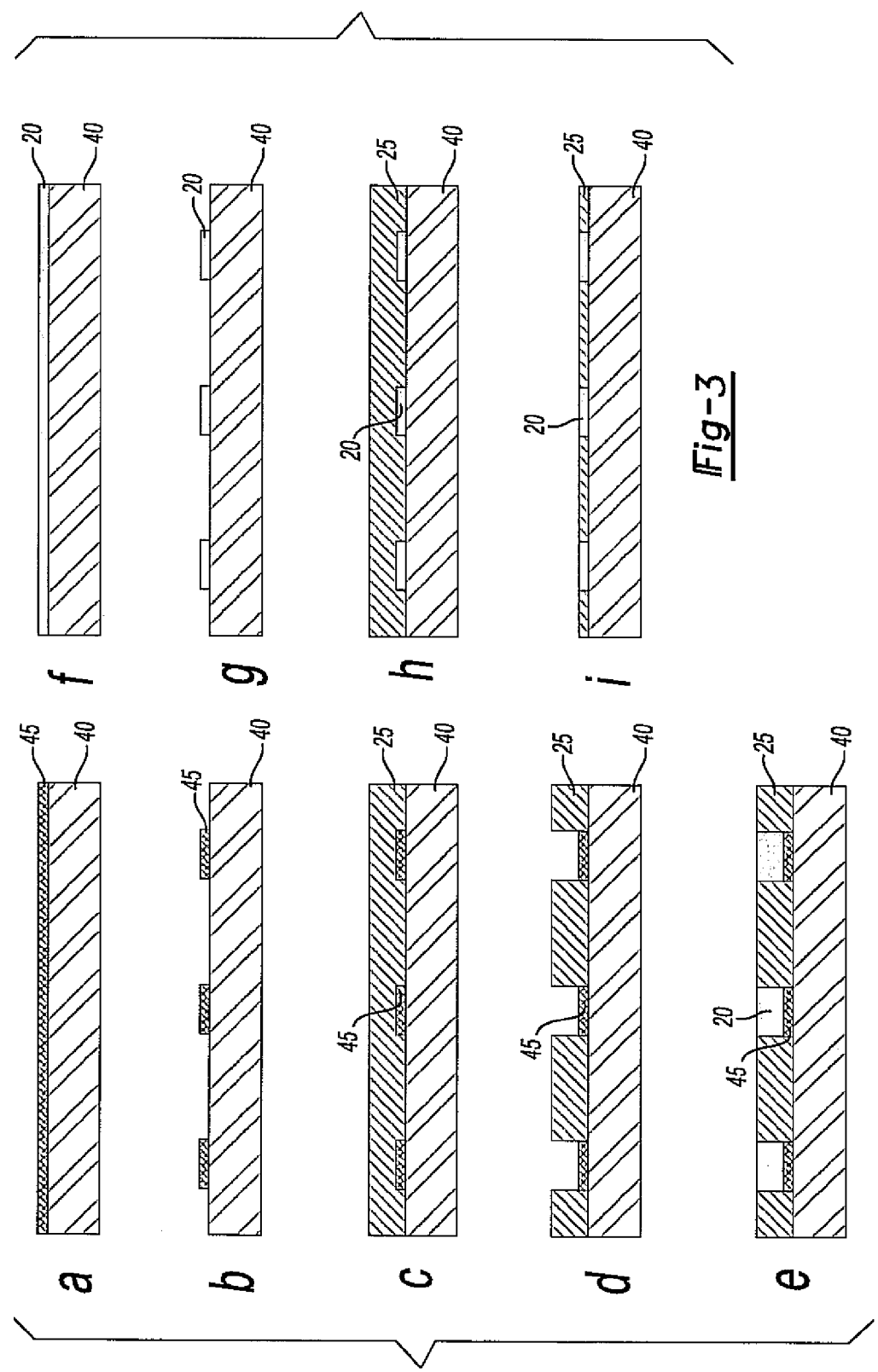

INTEGRATED (MULTILAYER) CIRCUITS AND PROCESS OF PRODUCING THE SAME

FIELD OF THE INVENTION

The invention relates to semiconductor integrated circuits and processes for producing semiconductor integrated circuits.

BACKGROUND OF THE INVENTION

Integrated circuits in three dimensions allow for the integration of various electronics and systems. Micro-bump technologies are known in the art and may be utilized to increase the density of interconnects in an integrated circuit. Current integrated circuits including micro-bumps and the processes utilized to create the circuits include high thermal processes that may generate cracks, increase the stress, and otherwise damage an integrated circuit. Additionally, high-temperature processes may cause the interdiffusion between various materials associated with the integrated circuit. Additionally, current art micro-bump technology does not provide adequate size and pitch dimensions utilizing the current materials and processes. For example, current processes for forming micro-bumps include solder reflow which laterally extends the bump dimension and makes it difficult to form a bump having a specified size and pitch. There is therefore a need in the art for an integrated circuit and process of forming an integrated circuit in which the micro-bump dimensions are closely controlled for both the size and pitch. There is also a need in the art for an improved integrated circuit and process that does not induce heat stress and other heat-related problems on an integrated circuit.

Current micro-bump technology generally requires the use of special tools and materials that increase the production complexity and cost of forming integrated circuits. Additionally, micro-bump formation processes often require the planarization of the bumps and bonding surface. Such planarization techniques often require additional processes and cost increases as well as pose difficulty in controlling the process parameters. There is a need in the art for an improved process of forming micro-bumps that solves the problems of expensive tools and complex processes.

Additionally, current prior art micro-bump processes generally include an after-bonding underfilling step that is utilized to underfill a gap between wafers. Such after-bonding underfilling is a complex process requiring the control of the viscosity of the underfilling material, which becomes more difficult when a bump height is in the micro scale. There is therefore a need in the art for an improved process that solves the problems associated with underfilling after a bonding process.

Additionally, there is a need in the art for an integrated circuit and process of producing an integrated circuit that utilizes a batch and wafer-level process. This batch and wafer-level fabrication enables mass production and cost reduction as well as decreases the device size and minimizes assembly mismatches.

SUMMARY OF THE INVENTION

In one aspect, there is disclosed a process of forming a semiconductor integrated circuit that includes the steps of: forming at least a first element having a first pattern of conductive material and including a polymer layer surrounding the conductive material, forming at least a second element having a second pattern of conductive material and including a polymer layer surrounding the conductive material, positioning the first element relative to the second element, and bonding the polymer layer of the first and second elements at a temperature below a melting temperature of the conductive materials of the first and second elements wherein the conductive material of the first element contacts the conductive material of the second element and is maintained in position by the bonded polymer layers.

In another aspect there is disclosed a semiconductor integrated circuit that includes at least a first element having a first pattern of conductive material and including a polymer surrounding the conductive material. The conductive material is exposed on a contact surface. At least a second element includes a second pattern of conductive material and has a polymer layer surrounding the conductive material. The conductive material is exposed on a contact surface. The first element and the second element are aligned such that the polymer layers of the first and second elements are aligned and bonded. The conductive material of the first element contacts the conductive material of the second element and is maintained in position by the bonded polymer layers.

BRIEF DESCRIPTION OF THE DRAWINGS

FIG. 2 is a diagram detailing the steps of the process of forming the first and second elements;

FIG. 3 is a diagram detailing the steps of forming a first and second element;

DETAILED DESCRIPTION OF THE PREFERRED EMBODIMENTS

Figure 1:
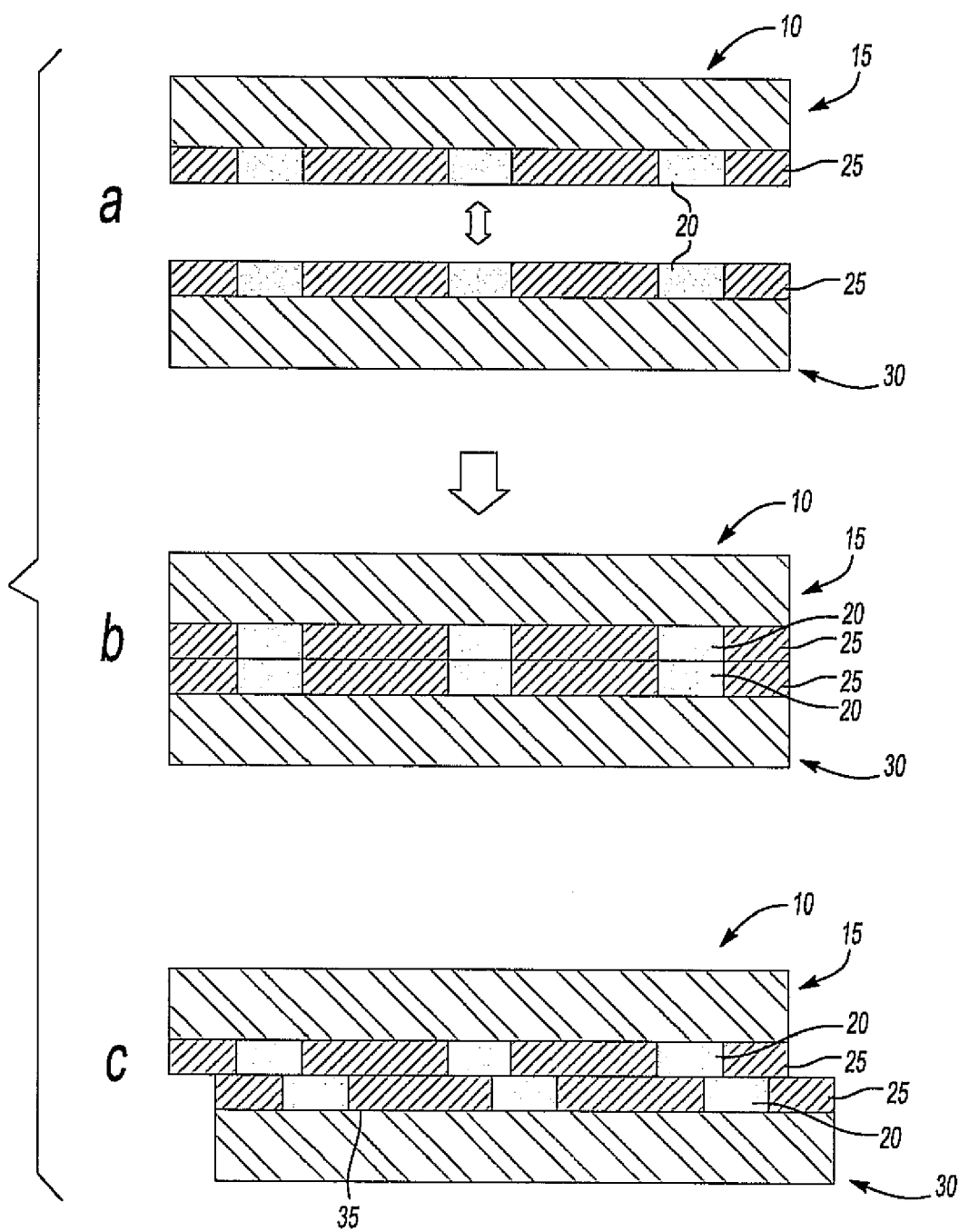
FIG. 1 is a diagram of an integrated circuit formed by the process.

Referring to FIG. 1, there is shown a diagram illustrating a process of forming a semiconductor integrated circuit 10. As can be seen in the diagram, at least a first element 15 having a first pattern of conductive material 20 and including a polymer layer 25 surrounding the conductive material 20 is provided. At least a second element 30 having a second pattern of conductive material 20 and including a polymer layer 25 surrounding the conductive material 20 is also provided. As shown in the diagram, there are first and second elements 15, 30. It should be realized that various numbers of elements 15 including a plurality of elements may be provided and joined, as will be discussed in more detail below. The at least first and second elements 15, 30 are positioned relative to each other. Next the polymer layers 25 of the first and second elements 15, 30 are bonded at a temperature below a melting temperature of the conductive materials 20 of the first and second elements 15, 30. The conductive material 20 of the first element 15 contacts the conductive material 20 of the second element 30 and is maintained in position by the bonded polymer layers 25. In one aspect, the conductive materials 20 of the first and second elements 15, only physically contact each other but are otherwise not bonded together such as in current prior art technology where the conductive materials are melted and integrated with each other.

As can be seen in the figure, two identical elements 15, 30 may be bonded face to face. Each of the elements 15, 30 includes the conductive material 20 and polymer layers 25. The conductive material 20 may be selected of any conducting material that provides a flat surface and sufficient height for the polymers. For example, various materials including solder metals, solder paste, non-solder metals such as copper, nickel, gold, aluminum or conductive polymers may be utilized. Similarly, the polymer layer 25 may be various polymers that may be secured along a planar bonding surface and allows for bonding at a temperature below the melting temperature of the conductive material 20. For example, various materials include SU-8, PDMS, polyimide, or Parylene. Such polymers provide a flat surface and may be bonded using various microfabrication techniques. The polymer provides the adhesion force that connects the conductive materials 20 of the first and second elements 15, 30. Additionally, the bonded polymer also functions as an underfilling adhesive or layer 35 and relieves stress as well as enhances the bonding strength of the first and second elements 15, 30.

Additionally, the bonding process allows for misalignment of the conductive materials 20 of the first and second elements 15, 30 and still maintains an electrical circuit or connection between the conductive materials 20 of the first and second elements 15, 30.

Various steps may be utilized to form the first and second elements 15, 30 of the process. Methods that may be utilized include electroplating, evaporation, solder transfer, sandwiched solder and wafer level processes, and various other techniques that will be described in more detail below.

Referring to FIG. 2, there is shown one embodiment of a process of forming the first and second elements 15, 30. In the illustrated embodiment, a substrate 40 material is provided as shown in step A. A seed material 45 may be deposited in step A. The seed material 45 may be selected so that it joins with a conductive material 20 in a following step. In one aspect, the seed material 45 may be evaporated/sputtered onto the substrate 40 material. In step B, the seed material 45 is patterned to a desired structure. Various patterning and etching techniques may be utilized. Next in step C, a polymer material 25 is deposited onto the substrate 40 including the seed material 45. Next in step D, the polymer material 25 is patterned or etched to expose the seed material 45. In step E, a conductive material 20 may be electroplated onto the seed material 45. The completed first or second element 15, 30 may be utilized in the bonding process described above. In one aspect, CMP or lapping may be utilized following the electroplating step. In another aspect, the polymer material 25 may also be used as an electroplating mask such that the conductive material 20 is positioned appropriately relative to the seed material 45.

Referring to FIG. 3, there is shown an alternative embodiment of forming the first and second elements 15, 30. In a first step, a substrate 40 material is provided and a conductive material 20 is deposited onto the substrate 40 by evaporation. Next in step G, the conductive material 20 may be patterned to an appropriate shape. Following the patterning of the conductive material 20, the polymer layer 25 is deposited onto the patterned conductive material 20 and substrate 40. Next the polymer layer 25 may be patterned or etched to expose the conductive material 20. In one aspect, the polymer layer 25 may be etched or polished to expose the conductive material 20. It should be realized that various etching and patterning techniques may be utilized and may vary based on the choice of polymer material 25 and conductive material 20.

Figure 4:
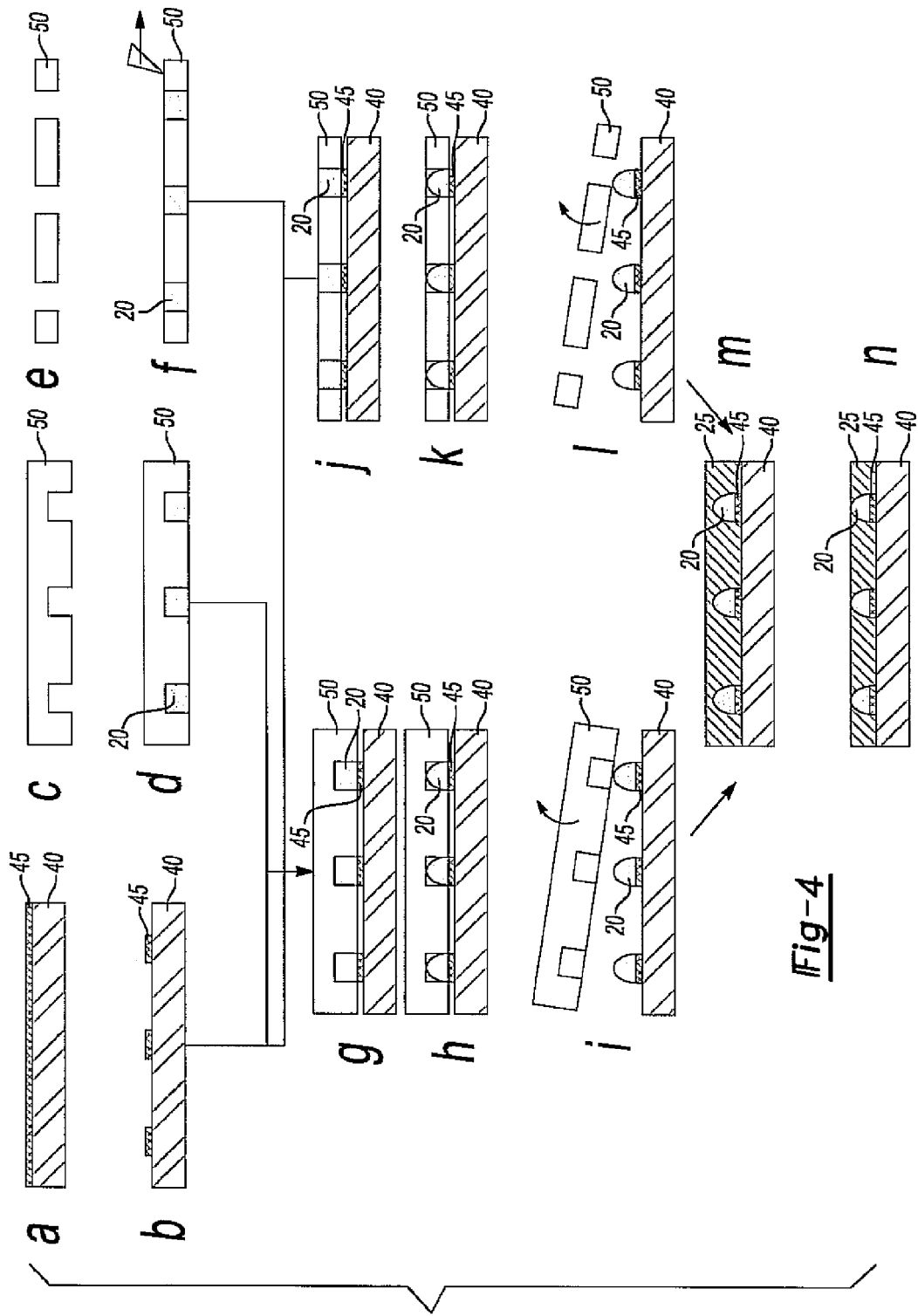
FIG. 4 is a diagram illustrating the steps of an alternative process of forming the first and second elements.

Referring to FIG. 4, there is shown another alternative embodiment of forming the first and second elements 15, 30. In a first step a substrate 40 material is provided and a seed material 45 is deposited on the substrate 40. Next the seed material 45 may be patterned. In a following step a conductive material mold 50 is formed. Next the conductive material 20 may be deposited into the conductive material mold 50. It should be realized that the steps provided above may not need to be performed sequentially but may be performed concurrently. For example, seed material 45 may be deposited on the substrate 40 while the conductive mold 50 is formed including the conductive material 20. Following the deposition of the conductive material 20 into the conductive material mold 50, the mold 50 is deposited or positioned on the substrate 40 material such that the conductive material 20 is deposited onto the patterned seed material 45. In a following step, the mold 50 is then removed. Next the polymer layer 25 may be deposited onto the substrate 40 including the seed material 45 and conductive material 20. Next the polymer material 25 may be patterned or polished such that the conductive material 20 is exposed. In one aspect, the process of forming the first and second elements 15, 30 shown in FIG. 4 may include the step of reflowing the exposed conductive material 20 following the deposition of the conductive material 20 onto the substrate 40 or following the deposition of the polymer material 25.

Figure 5:
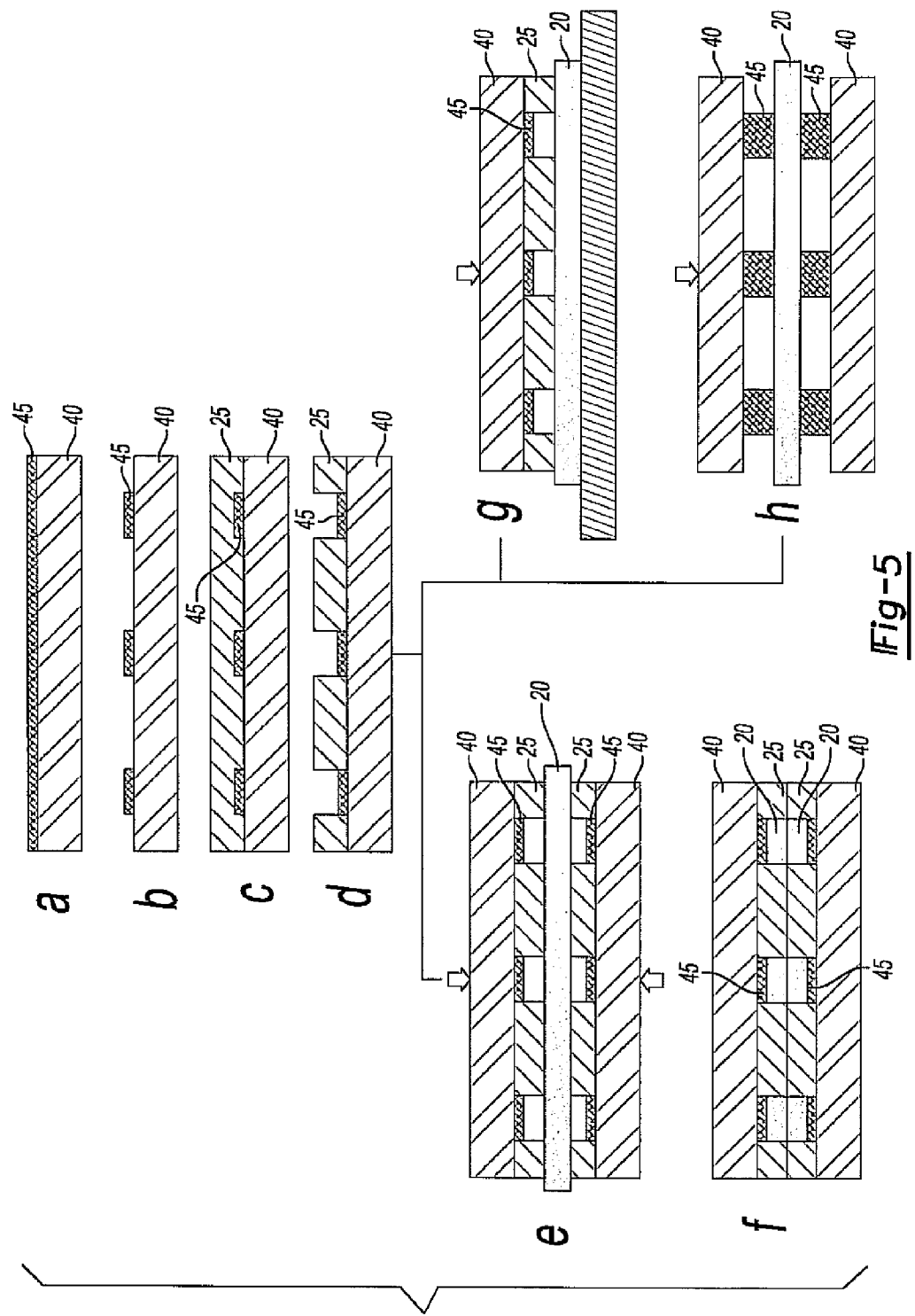
FIG. 5 is a diagram illustrating another alternative process of forming the first and second elements.

Referring to FIG. 5, there is shown another alternative embodiment of forming a first and second element 15, 30. As can be seen in FIG. 5, a substrate 40 material is provided in which a seed material 45 is deposited. The seed material 45 may be patterned to a desired shape or layout. Next a polymer layer 25 is deposited over the patterned seed material 45. The polymer layer 25 may be patterned in a following step. Next a sheet of conductive material 20 may be positioned between the first and second elements 15, 30. In a following step the first and second elements 15, 30 are pressed such that the first and second elements 15, 30 and the conductive material 20 are in contact with the seed material 45 and wherein the polymer layers 25 of the first and second elements 15, 30 are bonded. In one aspect, the step outlined in FIG. 5 may include applying heat and pressure to both the first and second elements 15, 30 while the conductive sheet 20 is positioned therebetween. In another aspect, each of the first and second elements 15, 30 may be separately formed such that the element is positioned on a hotplate or other source of heat when pressure is applied wherein the conductive material 20 is positioned relative to the seed material 45. Thereafter the first and second elements 15, 30 may be joined forming an integrated circuit 10. In one aspect, the conductive sheet 20 may be applied to one of the first and second elements 15, prior to the bonding of the polymer materials 25 of the first and second elements 15, 30.

Figure 6:
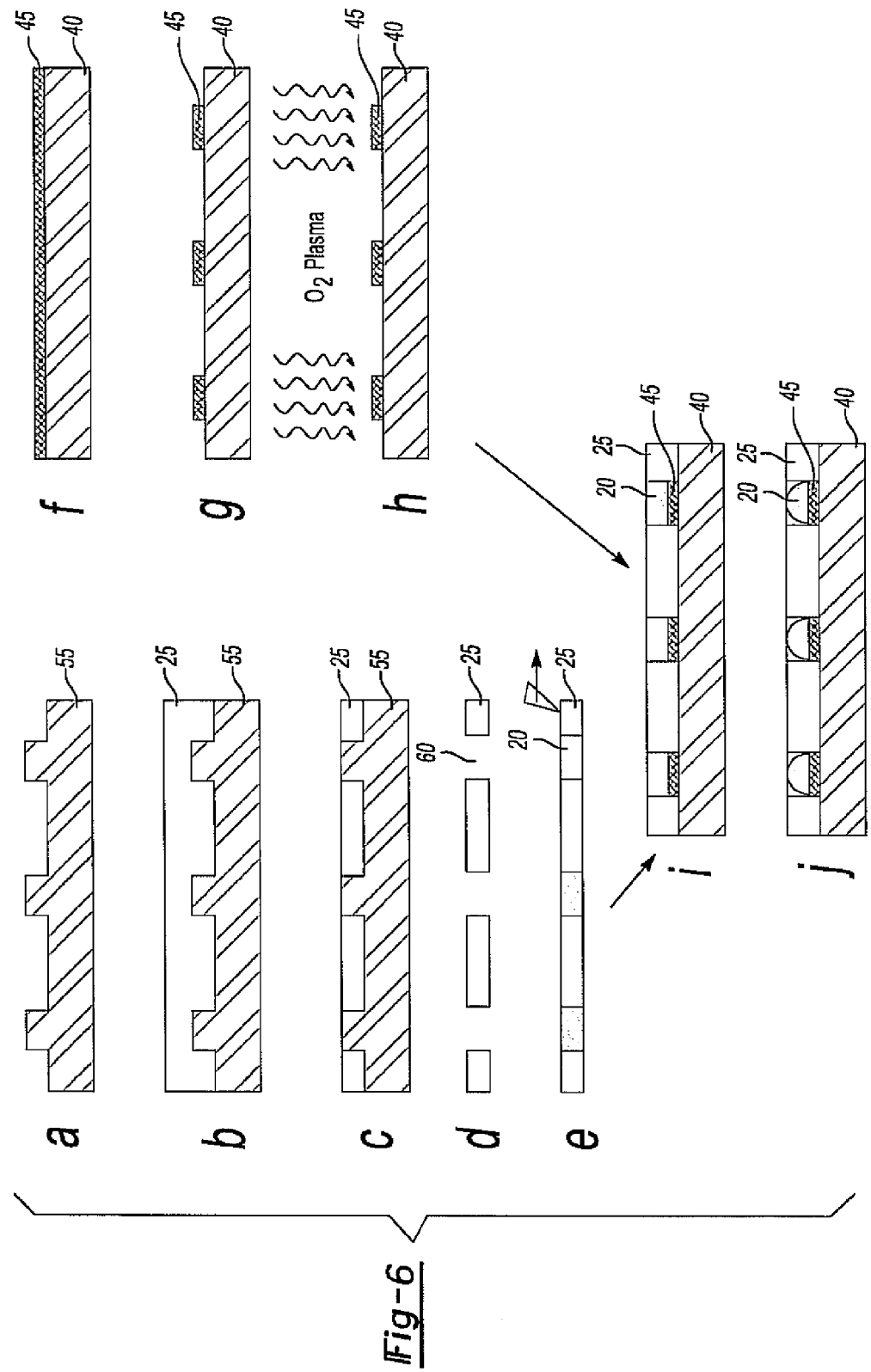
FIG. 6 is a further diagram illustrating another process of forming the first and second elements.

Referring to FIG. 6, there is shown another alternative embodiment of forming the first and second elements 15, 30. In the process of FIG. 6, a first step includes forming a polymer mold 55 of a desirable material, such as silicon or metal. Next a polymer material such as PDMS is applied to the mold 55. In a following step the PDMS material may be etched or polished forming perforated holes 60. In a next step the conductive material 20 may be screen printed or otherwise applied into the perforated holes 60. In another step, a substrate 40 material is provided and a seed material 45 is deposited onto the substrate 40 material. As described above, the steps of forming the mold 55 and applying the PDMS material may be performed concurrently with the patterning and application of seed material 45 onto a substrate 40 material. Following the deposition of the seed material 45 on the substrate 40, it is patterned to a desired layout. Next a surface of the PDMS 45 may be activated such as by exposure to oxygen plasma. In a next step, the PDMS material having the conductive material 20 is applied to the substrate 40 connecting the conductive material 20 to the seed material 45. The first and second elements 15, 30 formed may then be joined in the bonding process as outlined above. The conductive material may be heated up to reflow.

Figure 7:
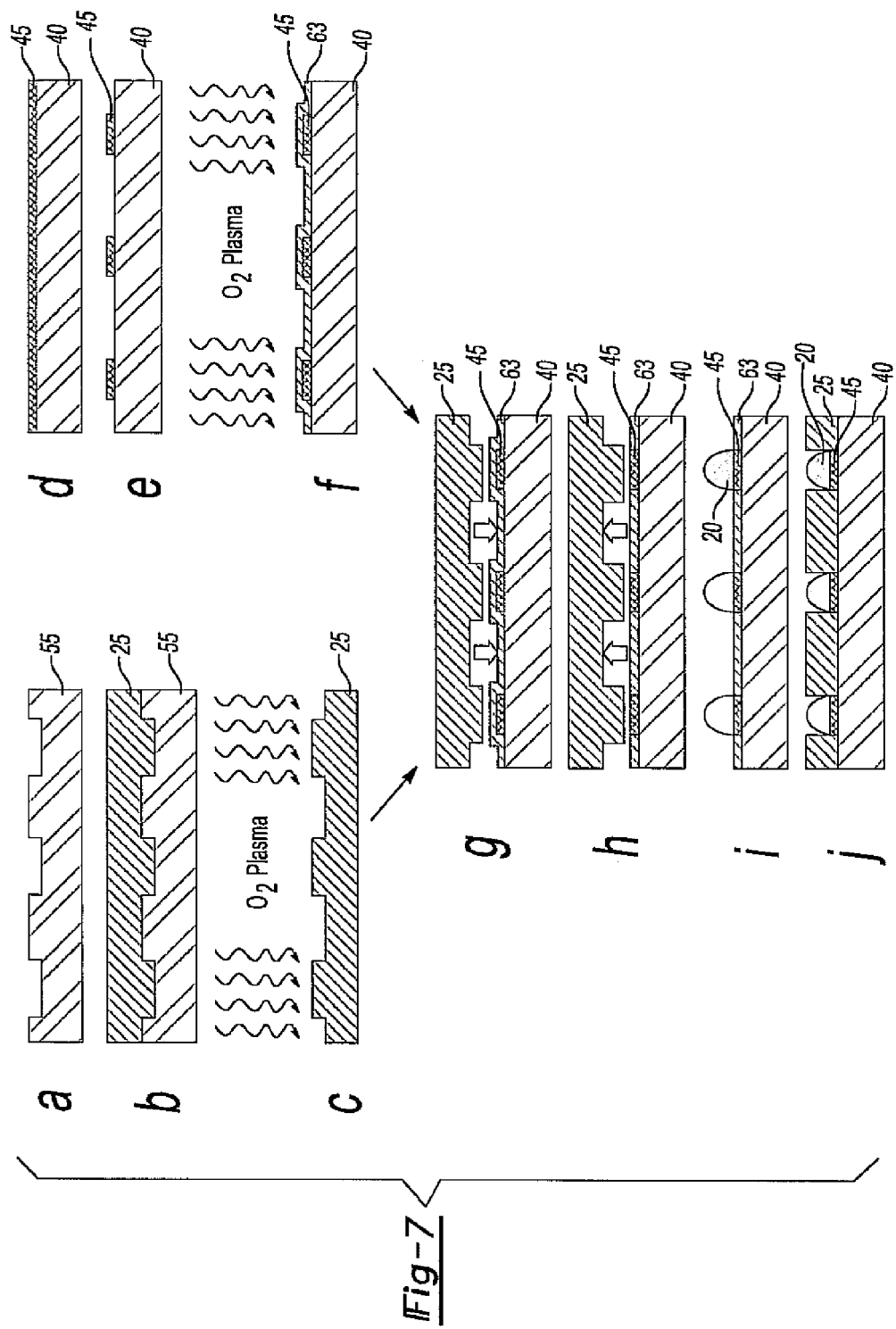
FIG. 7 is a diagram illustrating a further process of forming the first and second elements.

Referring to FIG. 7, there is shown another alternative embodiment of forming a first and second element 15, 30. As can be seen in the figure, a polymer mold 55 is formed and a polymer material such as PDMS is applied to the mold 55. Next the PDMS material may be detached from the mold 55. A substrate 40 is provided and a seed material 45 may be deposited onto the substrate 40 material followed by subsequent patterning of the seed material 45. Next a layer of PDMS 63 may be applied on the substrate 40 having the patterned seed material 45. The PDMS 63 may then be activated utilizing $O_2$ plasma or other techniques. Similarly, the attached PDMS material 25 is also activated. The activated detached PDMS material is bonded with the layer of PDMS 63 on the substrate 40. Next the bonded PDMS materials are removed to expose the seed material 45. Next a conductive material 20 is applied to the exposed seed material 45 forming the first and second elements 15, 30. In one aspect an additional conductive material 20 may be added as shown in FIG. 7-i, or an additional bonding polymer may be added as shown in FIG. 7-j.

Figure 8:
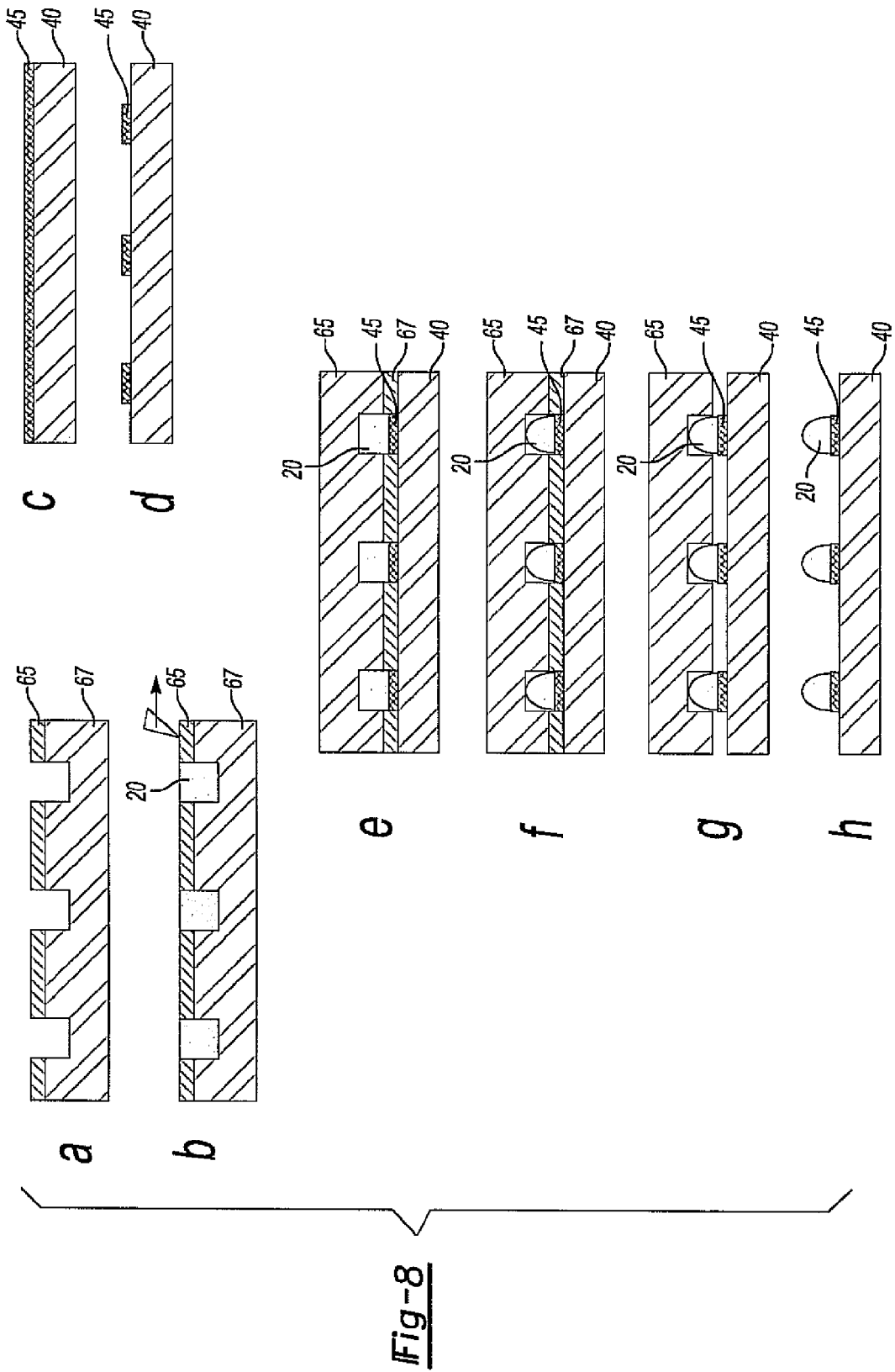
FIG. 8 is a diagram illustrating another alternative of forming the first and second elements.

Referring to FIG. 8, there is shown an alternative embodiment of forming a first and second element 15, 30. In a first step, a mold 65 formed of silicon may be formed using DRIE and a photoresist mask 67. In a following step the conductive material 20 may be applied into the etched mold 65. Next a substrate 40 material is provided with a seed material 45 deposited thereon and patterned to a desired layout. Next the silicon mold 65 is applied to the substrate 40 with subsequent reflowing of the conductive material 20. Next the photoresist mask 67 is removed and the silicon mold 65 is detached.

As stated above, the process of forming a semiconductor integrated circuit 10 may have a plurality of elements 15 that are joined in the process. In one aspect, at least one of the elements may be a MEMS device 70. Additionally, at least one of the elements may be a printed circuit board 80. In a further aspect, at least one of the elements may be an electronic circuit 75 that links the printed circuit board 80 with the appropriate MEMS device 70.

Figure 9:
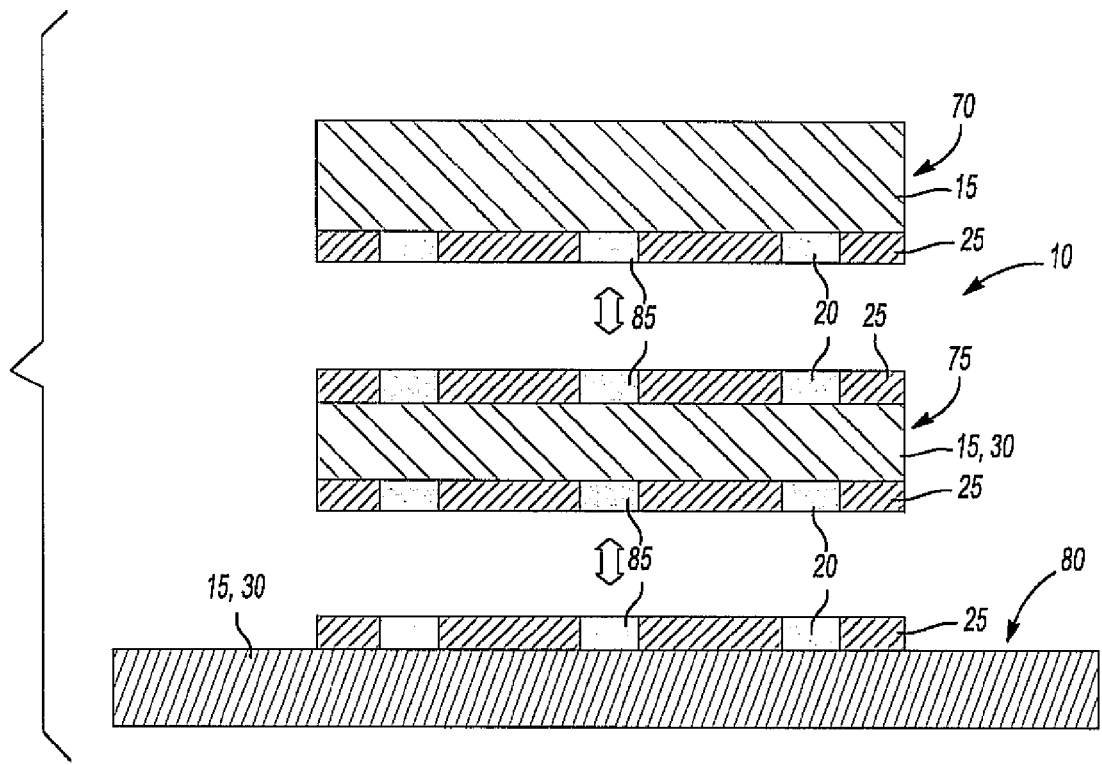
FIG. 9 is an illustration of an embodiment of an integrated circuit including a MEMS sensor, sensor control electronics, and a printed circuit board.

Referring to FIG. 9, there is shown one embodiment of a semiconductor integrated circuit 10. The semiconductor integrated circuit 10 includes at least a first element 15 having a first pattern of conductive material 20 and including a polymer layer 25 surrounding the conductive material 20. The conductive material 20 is exposed on a contact surface 85. At least a second element 30 having a second pattern of conductive material 20 includes a polymer layer 25 surrounding the conductive material 20. The conductive material 20 is exposed on a contact surface 85. The first and second elements 15, 30 may be aligned such that the polymer layers 25 of the first and second elements 15, 30 are aligned and bonded. The conductive materials 20 of the first and second elements 15, 30 contact each other and are maintained in position by the bonded polymer layers 25. As previously described above, the semiconductor integrated device 10 may include a plurality of elements 15 including patterns of conductive materials 20 and polymer layers 25 surrounding the conductive materials 20. The plurality of elements 15 may include polymer layers 25 that are bonded to each other such that the conductive materials 20 are in contact with each other and maintained in position by the bonded polymer layers 25. As shown in FIG. 9, a MEMS device 70 may be one of the plurality of elements 15. Various MEMS devices including accelerometers, yaw rate sensors, gyroscopes, pressure sensors, and other devices may be utilized. The MEMS device 70 includes a polymer layer 25 and conductive layer 20 as described above. A second element 15 of the plurality may include various sensor control electronics or sensing circuits or a power module. In one aspect, the second element 15 includes polymer layers 25 surrounding the conductive materials 20 on opposing sides of the second element 15. In this manner, the element 15 may be coupled with both the MEMS device 70 as well as a printed circuit board 80. The printed circuit board 80 may be included as a third element of the plurality of elements 15. As with the previous described elements 15, the printed circuit board 80 includes conductive material 20 surrounded by polymer materials 25. As described above, the polymer materials 25 of the adjacent elements 15 are bonded such that the conductive materials 20 contact each other forming an integrated circuit 10.

The invention claimed is:

1. A process of forming a semiconductor integrated circuit comprising the steps of:
    forming at least a first element having a first pattern of conductive material and including a polymer layer surrounding the conductive material;
    forming at least a second element having a second pattern of conductive material and including a polymer layer surrounding the conductive material;
    positioning the first element relative to the second element;
    bonding the polymer layer of the first and second elements at a temperature below a melting temperature of the conductive materials of the first and second elements;
    wherein the conductive material of the first element physically contacts the conductive material of the second element without deformation or transformation of the conductive materials of the first and second elements and is maintained in position by the bonded polymer layers.

2. The process of forming a semiconductor integrated circuit of claim 1 including forming a plurality of elements including patterns of conductive materials and polymer layers surrounding the conductive materials and bonding the plurality of polymer layers.

3. The process of forming a semiconductor integrated circuit of claim 2 wherein at least one of the elements is a MEMS device.

4. The process of forming a semiconductor integrated circuit of claim 2 wherein at least one of the elements is a PCB.

5. The process of forming a semiconductor integrated circuit of claim 2 wherein at least one of the elements is an electronic circuit.

6. The process of forming a semiconductor integrated circuit of claim 1 wherein the polymer is selected from: adhesives, dry-film photoresists such as Parylene, SU-8, BCB, Cytop, PMMA, polyimide, MYLAR, HD3000 series, HD7000 series, PerMX3000 series, MXAdvance*140.

7. The process of forming a semiconductor integrated circuit of claim 1 wherein the polymer layers are an underfill layer after the bonding process.

8. The process of forming a semiconductor integrated circuit of claim 1 wherein the step of forming the at least first or second elements includes the steps of: providing a substrate material; depositing a seed material; patterning the seed material; depositing the polymer material; patterning the polymer material; electroplating conductive material onto the seed material.

9. The process of forming a semiconductor integrated circuit of claim 8 including the step of CMP or lapping following electroplating the conductive material.

10. The process of forming a semiconductor integrated circuit of claim 1 wherein the step of forming the at least first or second elements includes the steps of: providing a substrate material; depositing the conductive material onto the substrate; patterning the conductive material; depositing the polymer material onto the patterned conductive material; patterning the polymer material exposing the conductive material.

11. The process of forming a semiconductor integrated circuit of claim 1 wherein the step of forming the at least first or second elements includes the steps of providing a substrate material; depositing a seed material; patterning the seed material; forming a conductive material mold; depositing the conductive material into the conductive material mold; depositing the exposed material onto the patterned seed material; removing the mold; depositing the polymer material; patterning the polymer material exposing the conductive material.

12. The process of forming a semiconductor integrated circuit of claim 11 including the step of reflowing the exposed conductive material following the deposition of the conductive material or following the deposition of the polymer material.

13. The process of forming a semiconductor integrated circuit of claim 1 wherein the step of forming the at least first or second elements includes the steps of: providing a substrate material; depositing a seed material; patterning the seed material; depositing the polymer material; patterning the polymer material; applying a sheet of the conductive material between the at least first and second elements; pressing the at least first and second elements connecting the conductive material to the seed material and bonding the polymer materials.

14. The process of forming a semiconductor integrated circuit of claim 13 wherein the conductive sheet is applied to one of the at least first or second elements prior to the bonding of the polymer materials of the first and second elements.

15. The process of forming a semiconductor integrated circuit of claim 1 wherein the step of forming the at least first or second elements includes the steps of: forming a PDMS mold; applying PDMS material to the mold; etching the PDMS material forming perforated holes; screen printing the conductive material into the perforated holes; providing a substrate material; depositing a seed material on the substrate material; patterning the seed material; activating a surface of the substrate material; applying the PDMS material having the conductive material to the substrate connecting the conductive material to the seed material.

16. The process of forming a semiconductor integrated circuit of claim 1 wherein the step of forming the at least first or second elements includes the steps of forming a PDMS mold; applying PDMS material to the mold, detaching the PDMS material from the mold; providing a substrate material; depositing a seed material on the substrate material; patterning the seed material; applying a layer of PDMS on the substrate having the patterned seed material and activating the substrate; activating the detached PDMS material; bonding the PDMS layers; detaching the PDMS layers exposing the seed material; applying a conductive material to the exposed seed material.

17. The process of forming a semiconductor integrated circuit of claim 1 wherein the step of forming the at least first or second elements includes the steps of: forming a silicon mold using DRIE and a photoresist mask; applying conductive material into the etched mold; providing a substrate material; depositing a seed material on the substrate material; patterning the seed material; applying the silicon mold to the substrate reflowing the conductive material; removing the photoresist mask; detaching the silicon mold.

18. The process of forming a semiconductor integrated circuit of claim 1 wherein the conductive material is selected from: copper, gold, tin, indium, nickel, solder-based material (SnPb), lead-free solder materials (SnAg, SnAgCu, SnCu, SnCo), isotropic conductive adhesive (ICA), and anisotropic conductive adhesive (ACA).

19. A semiconductor integrated circuit comprising:
at least a first element having a first pattern of conductive material and including a polymer layer surrounding the conductive material, the conductive material exposed on a contact surface;
at least a second element having a second pattern of conductive material and including a polymer layer surrounding the conductive material; the conductive material exposed on a contact surface;
the first element and the second element aligned such that the polymer layers of the first and second elements are aligned and bonded; wherein the conductive material of the first element physically contacts the conductive material of the second element without deformation or transformation of the conductive materials of the first and second elements and is maintained in position by the bonded polymer layers.

20. The semiconductor integrated circuit of claim 19 including a plurality of elements including patterns of conductive materials and polymer layers surrounding the conductive materials, the plurality of elements including polymer layers bonded to each other and the conductive materials in contact with each other and maintained in position by the bonded polymer layers.

21. The semiconductor integrated circuit of claim 20 wherein at least one of the elements is a MEMS device.

22. The semiconductor integrated circuit of claim 20 wherein at least one of the elements is a PCB.

23. The semiconductor integrated circuit of claim 20 wherein at least one of the elements is an electronic circuit.

24. The semiconductor integrated circuit of claim 19 wherein the polymer is selected from: adhesives, dry-film photoresists such as Parylene, SU-8, BCB, Cytop, PMMA, polyimide, MYLAR, HD3000 series, HD7000 series, PerMX3000 series, MXAdvance*140.

25. The semiconductor integrated circuit of claim 19 wherein the conductive material is selected from: copper, gold, tin, indium, nickel, aluminum, solder-based material (SnPb), lead-free solder materials (SnAg, SnAgCu, SnCu, SnCo), isotropic conductive adhesive (ICA), and anisotropic conductive adhesive (ACA).

26. The semiconductor integrated circuit of claim 19 wherein the polymer layers are an underfill layer after the bonding process.

* * * * *